(12) United States Patent
Gerhaeusser et al.

(10) Patent No.: US 9,808,973 B2
(45) Date of Patent: Nov. 7, 2017

(54) INSERT-MOULDED LEAD FRAME AND METHOD FOR THE PRODUCTION THEREOF

(71) Applicant: Robert Bosch GmbH, Stuttgart (DE)

(72) Inventors: Martin Gerhaeusser, Brackenheim-Stockheim (DE); Giuseppe Barone, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/916,186

(22) PCT Filed: Aug. 1, 2014

(86) PCT No.: PCT/EP2014/066640
§ 371 (c)(1),
(2) Date: Mar. 3, 2016

(87) PCT Pub. No.: WO2015/032559
PCT Pub. Date: Mar. 12, 2015

(65) Prior Publication Data
US 2016/0214292 A1    Jul. 28, 2016

(30) Foreign Application Priority Data
Sep. 3, 2013 (DE) .................... 10 2013 217 549

(51) Int. Cl.
*H05K 1/00* (2006.01)
*B29C 45/14* (2006.01)
(Continued)

(52) U.S. Cl.
CPC .... *B29C 45/14639* (2013.01); *B29C 45/1671* (2013.01); *H01L 21/4821* (2013.01);
(Continued)

(58) Field of Classification Search
CPC .......... B29C 45/14639; B29C 45/1671; H01L 21/4821; H01L 23/49534; H05K 3/202
(Continued)

(56) References Cited

U.S. PATENT DOCUMENTS

| 4,821,413 A * | 4/1989 | Schmitt ................ H01R 13/405 264/272.11 |
| 2008/0200048 A1* | 8/2008 | Matsuura ............. H01R 12/616 439/78 |

FOREIGN PATENT DOCUMENTS

| DE | 36 12 576 C1 | 6/1987 |
| DE | 198 04 607 A1 | 10/1999 |

(Continued)

OTHER PUBLICATIONS

International Search Report corresponding to PCT Application No. PCT/EP2014/066640, dated Oct. 21, 2014 (German and English language document) (7 pages).

*Primary Examiner* — Tremesha S Willis
(74) *Attorney, Agent, or Firm* — Maginot, Moore & Beck LLP (57) ABSTRACT

An encapsulated lead frame has a core element with multiple elongated conductor tracks arranged next to one another. The lead frame also has first partial encapsulations formed by a first encapsulation of the core element in first subregions and second partial encapsulations formed by a second encapsulation of the core element in second subregions. The first and second partial encapsulations enclose the core element as an overall encapsulation. The first partial regions are spaced apart from one another and each of the first partial encapsulations respectively surrounds only one single conductor track. This configuration avoids gaps that may form at interfaces between a first and second partial encapsulation, may extend between two adjacent conductor tracks, and may allow conductive fluid to accumulate therein (Continued)

and form short-circuits between adjacent conductor tracks. The encapsulated frame is used in a transmission control device. A method for producing an encapsulated lead frame is disclosed.

7 Claims, 6 Drawing Sheets

(51) Int. Cl.
  *B29C 45/16* (2006.01)
  *H01L 21/48* (2006.01)
  *H01L 23/495* (2006.01)
  *H05K 3/20* (2006.01)
  *B29K 705/00* (2006.01)
  *B29L 31/34* (2006.01)

(52) U.S. Cl.
  CPC .. *H01L 23/49534* (2013.01); *H01L 23/49541* (2013.01); *B29K 2705/00* (2013.01); *B29K 2995/0005* (2013.01); *B29K 2995/0007* (2013.01); *B29L 2031/3493* (2013.01); *H01L 2924/0002* (2013.01); *H05K 3/202* (2013.01); *H05K 2201/09118* (2013.01)

(58) Field of Classification Search
  USPC .................. 174/250, 251, 255–258, 261
  See application file for complete search history.

(56) References Cited

FOREIGN PATENT DOCUMENTS

| DE | 10 2009 046 467 A1 | 5/2011 |
|---|---|---|
| DE | 10 2009 047 051 A1 | 5/2011 |
| DE | 10 2010 019 027 A1 | 11/2011 |
| JP | 2001-167838 A | 6/2001 |

\* cited by examiner

INSERT-MOULDED LEAD FRAME AND METHOD FOR THE PRODUCTION THEREOF

This application is a 35 U.S.C. §371 National Stage Application of PCT/EP2014/066640, filed on Aug. 1, 2014, which claims the benefit of priority to Serial No. DE 10 2013 217 549.3, filed on Sep. 3, 2013 in Germany, the disclosures of which are incorporated herein by reference in their entirety.

BACKGROUND

The present disclosure relates to a lead frame, as can be used in particular for the connection of a controlling means usable in a vehicle transmission, and to a method for the production of a lead frame.

Lead frames are used, for example, in motor vehicle manufacturing in order to make electrical contact with control devices. For example, control modules which are installed in an oil-filled transmission interior space are used in motor vehicle automatic transmissions for controlling clutch and gear shifting operations. Insert-molded lead frames are used here for electric line routing.

Lead frames are preferably flat elements on which electronic components can also be mounted. Electrically conductive sections in the form of singular conductor tracks are present on the lead frames, in particular on a core element which is arranged centrally and is surrounded by an electrically insulating casing. The core element is generally produced here from plastic or metal, wherein, in the case of a design from plastic, the conductor tracks are mounted as conductive layers on a carrier substrate.

DE 10 2009 046 467 A1 describes a lead frame with a special surface contour, and a control device with such a lead frame. A conventional method for producing a lead frame is also described.

Summarized in brief, in a first production step, core elements of the lead frames are formed by means of punching methods. The individual core elements are mechanically connected to one another here at a number of points, and therefore it is not necessary for each individual core element to be inserted into a corresponding die during a subsequent insert-molding operation.

The core elements are subsequently insert-molded with a plastic in order to form a casing around the core elements and in order thereby firstly to ensure a necessary electrical insulation to the outside and secondly to achieve mechanical stabilization.

In a second production step, a partial pre-insert molding takes place in the form of a first partial insert-molding of the core elements of the lead frame, in which, however, partial regions, for example the connecting points which hold the individual core elements together, are generally not insert molded. Said partial regions can form opening regions which generally have dimensions of 1 to 2 mm.

In a third production step, the core elements are separated from one another. The connecting points between the core elements are punched out or separated in some other manner here. This gives rise to a multiplicity of individual core elements or conductor tracks which are generally not connected electrically to one another. The previously provided pre-insert-molding generally surrounds a plurality of core elements here and holds said core elements together and in the required geometrical position thereof.

In a final fourth production step, a main insert molding takes place in the form of a second partial insert-molding of the individual pre-insert-molded core elements. In this case, in particular those regions of the lead frame which are not covered by the pre-insert-molding are insert-molded, but also the pre-insert-molded regions can be partially insert-molded, and therefore pre-insert-molded and main insert-molded regions may partially overlap laterally.

In order to avoid a displacement of individual sections of the core elements of the lead frames with respect to one another and to ensure the desired position of the core elements, in the insert-molding die for the main insert-molding, necessary support regions are brought into contact with the pre-insert-molding such that the support regions ensure a positioning in the insert-molding die for the main insert-molding. However, this results in the main insert-molding not being able to completely surround the core element, but rather being interrupted at least at the support regions mentioned, and therefore partial regions of the pre-insert-molding are not covered and are outwardly exposed.

In the case of conventional lead frames, in particular if said lead frames have been used for forming controlling means, for example automatic transmission controlling means which are to be used in aggressive media, malfunctions have been observed.

SUMMARY

Embodiments of the disclosure permit a lead frame and a transmission control device which is formed therewith, and also advantageous production of a lead frame, in which a risk of fluids passing, because of leakages in an encasing insert-molding, to core elements of the lead frame and having a damaging effect there is minimized.

According to a first aspect of the present disclosure, an insert-molded lead frame is proposed which has a core element and first and second partial insert-moldings. The core element here has a plurality of elongate conductor tracks arranged next to one another. The first partial insert-moldings are formed by a first insert molding of the core element on first partial regions of the core element. The second partial insert-moldings are formed by a second insert molding of the core element on second partial regions of the core element. The first and the second partial insert-moldings together form a complete insert-molding which completely encases the core element. The lead frame is distinguished here in that adjacent first partial regions are spaced apart from one another, and each of the first partial insert-moldings in each case surrounds only one individual conductor track.

According to a second aspect of the disclosure, a method is proposed for the production of a corresponding lead frame, wherein, in individual method steps, corresponding first and second partial insert-moldings are formed around a provided core element in such a manner that, in a finished lead frame, each of the first partial insert-moldings in each case surrounds only one individual conductor track.

Ideas regarding embodiments of the disclosure can be considered, inter alia, as involving the findings and concepts described below.

As stated in the introduction, functional disturbances have been observed in conventional lead frames, in particular when said lead frames have been arranged directly in the interior of a transmission, for example for the connection of components of a transmission control device, and have therefore been exposed to the action there of aggressive media, in particular aggressive transmission oil. It is presumed that leakages arise in said lead frames, for example in the form of fine hairline cracks, and aggressive media can pass at said leakages into the interior of the insert-molded lead frame. The aggressive media may chemically attack, or even destroy, components there of the lead frame, for example the metallic conductor tracks. As an alternative or in addition thereto, components which provide for electrical conductivity of the media may be contained in the penetrating media, and therefore, in the worst case scenario, an electrical short-circuit path may be formed by a medium penetrating as far as the interior of a lead frame. Conductor tracks of the lead frame may be interrupted or short-circuited because of these effects, as a result of which malfunctions of the circuit formed therewith may be brought about.

It is assumed that the leakages mentioned may occur in particular in regions adjacent to the first insert-molding within the lead frame. As will be explained in detail further below, said first insert-molding has served to date inter alia to mechanically fix the conductor tracks, which are to be accommodated in the complete plastics insert-molding, temporarily in relation to one another during the production of a lead frame. Up to now, such first insert-moldings have generally been formed as a first local insert-molding of a plurality of adjacent conductor tracks and therefore extend in the same plane as the conductor tracks themselves. However, at the transition to a subsequently formed, second insert-molding, fine gaps may be formed, into which aggressive media may penetrate and may pass as far as the conductor tracks which are held together by the first insert-molding and are encased by the second insert-molding.

It has now been recognized that the problem mentioned can be prevented or at least mitigated by the first partial insert-moldings forming the first insert-molding being formed or at least aftertreated in such a manner that, at the finished, insert-molded lead frame, each of the first partial insert-moldings in each case surrounds only one single conductor track. By this means, the proposed lead frame differs from conventional lead frames in which the first insert-molding generally surrounds a plurality of adjacent conductor tracks. Since each first partial insert-molding surrounds only one individual conductor track, it is possible to prevent a gap from forming adjacent to a first partial insert-molding, the gap reaching from one conductor track to an adjacent conductor track. In a corresponding manner, it is possible to prevent conductive media, for example transmission oil mixed with metal ions, from being able to accumulate in such a gap and thus being able to produce an electrically conductive path between adjacent conductor tracks and ultimately a short circuit between said conductor tracks.

In the finished insert-molded lead frame, the first partial insert-moldings can extend at least from one of the conductor tracks as far as an outer surface of the complete insert-molding. In other words, the first partial insert-moldings can be outwardly exposed in the complete insert-molding. This follows, inter alia, from the purpose of said partial insert-moldings during the formation of the complete insert-molding, since said partial insert-moldings are intended to retain the core element within an injection-molding die during the formation of the second partial insert-moldings. Contact surfaces within the injection-molding die bear here against the first partial insert-moldings, and therefore the latter are not insert-molded during the second partial insert molding and therefore are ultimately exposed.

The aim that each first partial insert-molding in each case surrounds only one individual conductor track can be realized in different ways in terms of production.

For example, each of the first partial insert-moldings can be formed on the first partial regions of the core element by local insert molding of an individual conductor track in each case. In other words, even as the first partial insert-moldings are being formed, injection molding can be carried out, for example by using a suitable die, in such a manner that each of the first injection-molded plastics regions in each case surrounds only one individual conductor track and does not reach as far as adjacent conductor tracks.

Alternatively, first partial insert-moldings can be formed by local insert molding of a plurality of adjacent conductor tracks, and subsequently an insert-molding formed in such a manner can be interrupted in regions between adjacent conductor tracks. In other words, during the production of the lead frame, first of all, in a similar manner as in conventional production methods, a plurality of conductor tracks can be insert-molded together and only subsequently can regions of such an insert-molding be later removed, again in a targeted manner. For example, such regions can be punched away.

The insert-molding formed by local insert molding of a plurality of adjacent conductor tracks can be interrupted in regions between adjacent conductor tracks before or alternatively after the second partial insert-moldings are formed. In other words, such a wider-area first insert-molding can already be removed again in regions between adjacent conductor tracks before the second partial insert-molding is formed or alternatively only after such a second partial insert-molding has been formed. Both variant embodiments can afford advantages in terms of production.

In order to stabilize the core element and in particular the conductor tracks provided therein during the insert molding, a stabilizing insert-molding connecting a plurality of conductor tracks of the core element can be formed at end regions of the core element before the second partial insert-molding is formed. In principle, such a stabilizing insert-molding can be formed in a separate injection-molding operation. However, it may be preferred to form the stabilizing insert-molding together with the first partial insert-moldings. After the second partial insert-moldings have been formed and the components of the core element are therefore fixedly connected to one another, such a stabilizing insert-molding may optionally be removed again.

It is pointed out that possible features and advantages of embodiments of the disclosure are herein described partially with respect to a lead frame according to the disclosure and partially with respect to a method for producing such a lead frame. A person skilled in the art recognizes that the features described can be combined or interchanged in a suitable manner in order to arrive at further embodiments and optionally synergistic effects.

BRIEF DESCRIPTION OF THE DRAWINGS

Embodiments of the disclosure are described below with reference to the attached drawings, wherein neither the description nor the drawings should be interpreted as restricting the disclosure.

The figures are merely schematic and are not to scale. Identical reference signs refer in the various figures to identical features or features with like effect.

DETAILED DESCRIPTION

Figure 1:
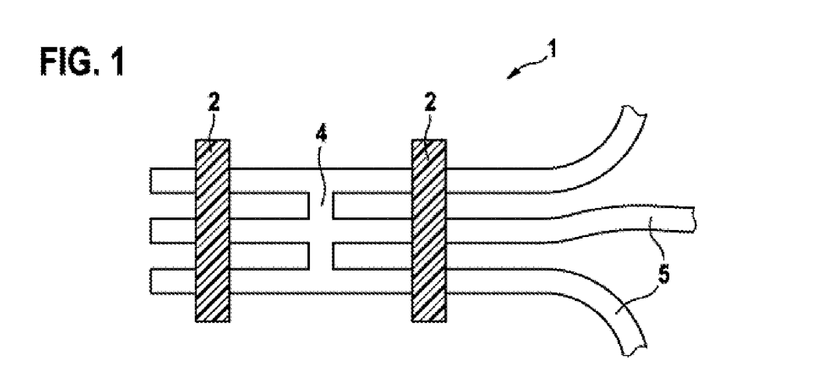
FIG. 1 shows, in top view, conductor tracks of a conventional lead frame, which conductor tracks are connected by webs and a first insert-molding, before a second insert molding.

Features of a conventional lead frame and a method for the production thereof are first of all described with respect to FIGS. 1 to 5:

First of all, in a first production step, conductor tracks 5 of the lead frame 1 are formed by means of punching methods, for example by punching from a metal sheet. The individual conductor tracks 5 are joined here to one another at a number of points by webs 4, and therefore it is not necessary for each individual conductor track 5 to be inserted into a corresponding die during a subsequent insert-molding operation.

The conductor tracks 1 are subsequently insert-molded with a plastic in order to form first partial insert-moldings 2. Said first partial insert-moldings 2 fix the therefore connected conductor tracks 5 with respect to one another after the previously connecting webs 4 have been removed by being punched free.

Figure 2:
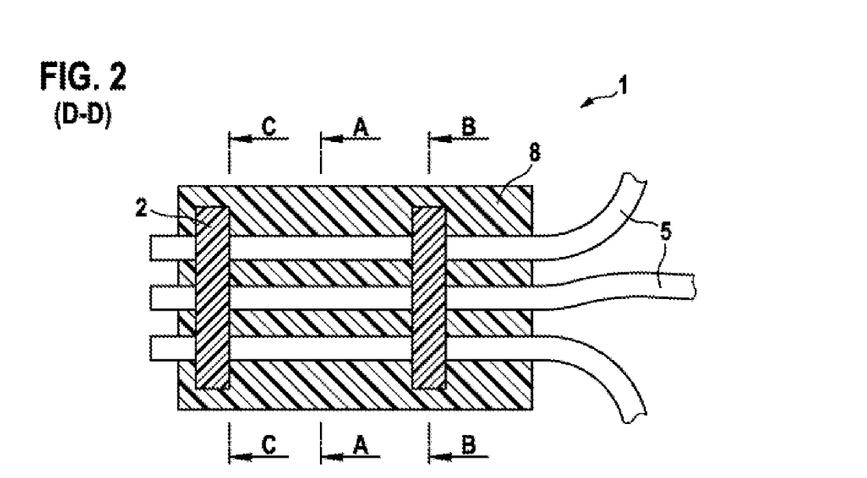
FIG. 2 shows a top view of the lead frame from FIG. 1 after the second insert molding.
Figure 3:
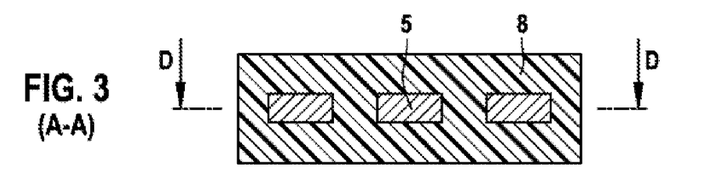
FIGS. 3 to 5 show cross-sectional views along the sections A-A, B-B and C-C from FIG. 2.

The conductor tracks 5 provided in such a manner and retained by first partial insert-moldings 2 are then inserted into a suitable insert-molding die in which said conductor tracks are insert molded with a second partial insert-molding 8 composed of electrically insulating plastic (FIG. 2). In order to be able to insert mold the conductor tracks 5 on both sides, said conductor tracks are retained here within the insert-molding die via knobs which are supported on the first partial insert-moldings 2. The second partial insert-molding 8 completely surrounds the conductor tracks 5 in wide regions, as shown along the lines A-A in the sectional illustration illustrated in FIG. 3. The line D-D in FIG. 3 indicates the plane along which the top view from FIG. 2 is illustrated.

Figure 4:
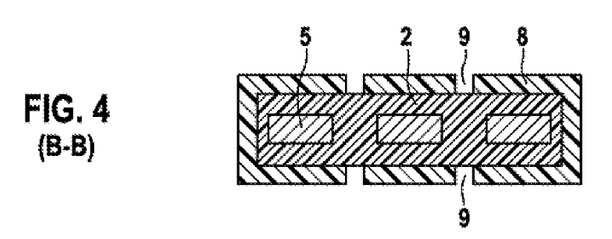

FIG. 4 illustrates a sectional view along the plane B-B from FIG. 2. The conductor tracks 5 are enclosed here by the first partial insert-molding 2, and said first partial insert-molding 2 is in turn surrounded by the second partial insert-molding 8. However, the second partial insert-molding 8 is locally interrupted here in the regions 9 in which the knobs of the insert-molding die are supported on the first partial insert-moldings 2 during the insert molding.

Figure 5:
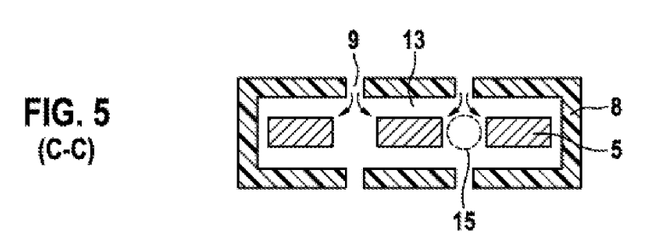

FIG. 5 shows a sectional view along the plane C-C from FIG. 2, that is to say directly at an edge of a first partial insert-molding 2. At said edge, there is a transition between the material of the first partial insert-molding 2 and the material of the second partial insert-molding 8. These materials and also the material of the conductor tracks 5 can have different coefficients of thermal expansion, and therefore microscopically small gaps 13 may form in said region because of temperature fluctuations, into which gaps, for example, aggressive media may penetrate via the outwardly exposed regions 9 into the interior of the insert-molding and pass as far as the conductor tracks 5. The penetrated media can reside for a long time in the interior of the second partial insert-molding 8 and, for example, may attach and/or chemically convert the conductor tracks 5 and/or form deposits.

Such operations may have a disadvantageous effect in particular in regions 15 between adjacent conductor tracks 1 such that, for example, conductive reaction products may form an electrical connection between the adjacent conductor tracks 1, and therefore local short circuits may occur.

Embodiments of a method according to the disclosure for the production of a lead frame according to the disclosure will now be described with reference to FIGS. 6 to 9.

As illustrated in FIG. 6(*a*), first of all a core element 3 is provided with a plurality of elongate conductor tracks 5 arranged next to one another. The conductor tracks 5 are connected to one another here by means of webs 4. The entire core element 3 can be punched, for example, out of a metal sheet and can therefore be integral.

In the following method step, as illustrated in FIG. 6(*b*), first partial insert-moldings 2 are formed on first partial regions of the core element 3. For this purpose, the core element 3 is placed into a suitable injection-molding die which, in the first partial regions in which the first partial insert-moldings 2 are to be formed, has suitable cavities, into which liquid plastic is then injected. The liquid plastic here should be electrically non-conductive and may be, for example, PEEK. At the same time as the formation of the first partial insert-moldings 2, stabilizing insert-moldings 10, which enclose a plurality of adjacent conductor tracks 5 and connect the latter to one another in a mechanically stabilizing manner, are formed at the two opposite ends of the core element 3.

In a subsequent method step, the webs 4 are removed, for example by local punching away, as shown in FIG. 6(*c*).

Subsequently, in a second injection-molding process, the core element 3 together with the first partial insert-moldings 2 formed thereon is placed into a suitable injection-molding die and second partial insert-moldings 8, as shown in FIG. 6(*d*), are formed by injecting plastic. The core element 3 is retained here within the injection-molding die via the first partial insert-moldings 2, and therefore these regions are not insert-molded at the same time, and the first partial insert-moldings 2 are subsequently outwardly exposed. However, the rest of the core element 3 is completely enclosed by the second partial insert-moldings 8 at least in a central region, that is to say with the exception of the ends of the conductor tracks 5, such that the first and the second partial insert-moldings 2, 8 together completely encase the core element 3, as is shown in FIG. 6(*d*).

Finally, the stabilizing insert-moldings 10 can be removed, for example by punching off, as shown in FIG. 6(*e*).

Figure 6A:
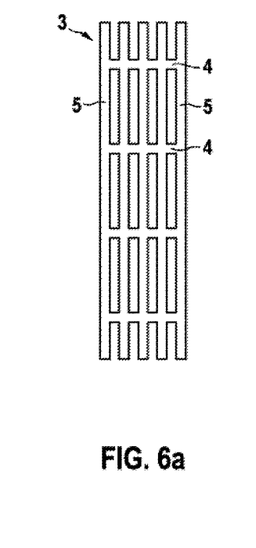
FIGS. 6 to 9 each show, in top view, components of a lead frame in a sequence of method steps of a production method according to various embodiments of the present disclosure.
Figure 6B:
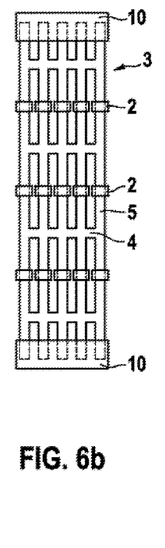
Figure 6C:
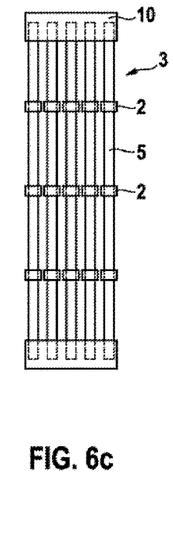
Figure 6D:
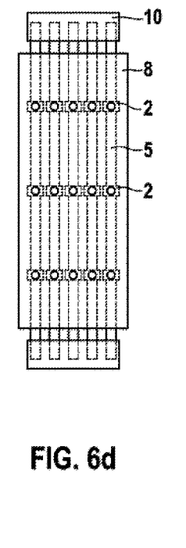
Figure 6E:
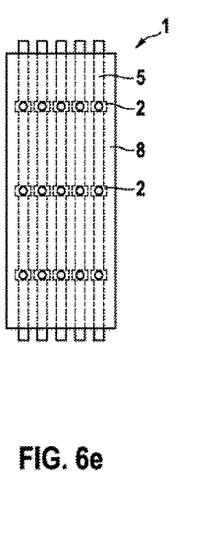
Figure 7A:
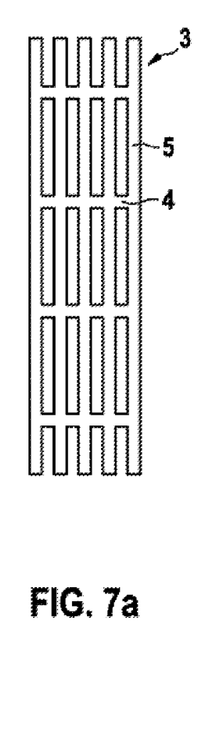
Figure 7B:
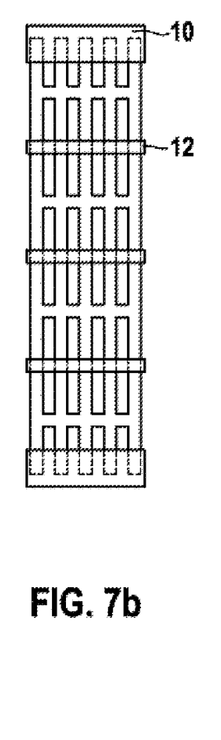
Figure 7C:
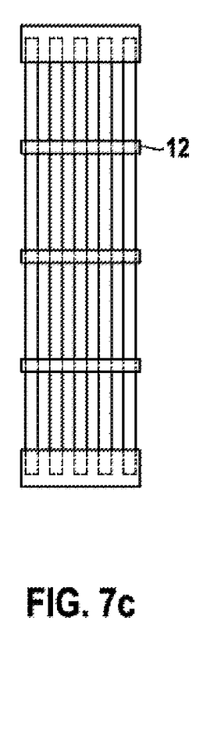
Figures 7D, 7E:
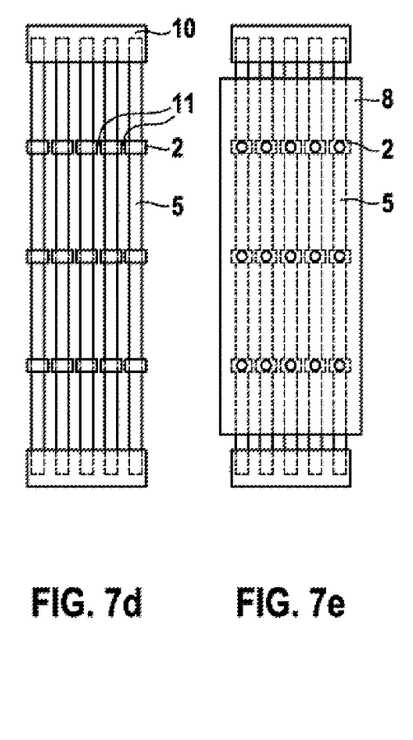
Figure 7F:
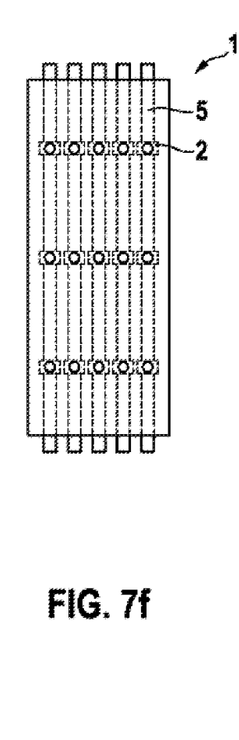

In the finished, insert-molded lead frame 1 produced in such a manner, the elongate conductor tracks 5 are completely accommodated in the complete insert-molding. It is true that gaps into which fluids may penetrate may form, for example due to thermal expansion, at boundary surfaces between the first partial insert-moldings 2 and the second partial insert-moldings 8. Since, however, each of the first partial regions 2 is only in contact with an individual conductor track 5, said gaps cannot extend between adjacent conductor tracks 5 and therefore short circuits cannot be caused via conductive fluid brought about in said gaps.

In the exemplary embodiments illustrated in FIGS. 7, 8 and 9, as illustrated in the respective figures (b), first of all a plurality of adjacent conductor tracks 5 are jointly insert-molded in a pre-insert-molding, as a result of which retaining insert-moldings 12 are formed. After such a pre-insert-molding, adjacent conductor tracks 5 are retained relative to one another and can therefore readily be processed as a unit in a subsequent punching operation or insert-molding operation.

As illustrated in FIG. 7(*d*), regions 11 of the retaining insert-molding 12 between adjacent conductor tracks 5 can be interrupted here, for example, by local punching free. Subsequently, in a further injection-molding operation, as illustrated in FIG. 7(e), the second partial insert-moldings 8 can be formed.

Figure 8A:
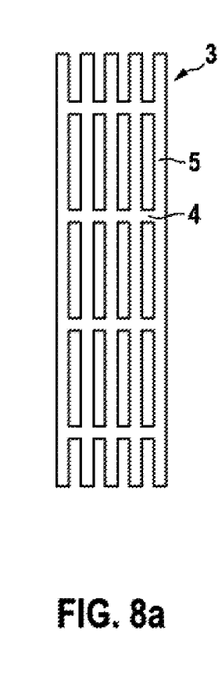
Figure 8B:
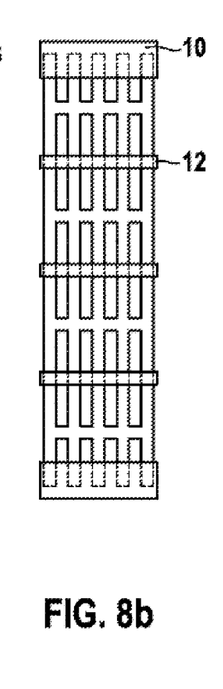
Figure 8C:
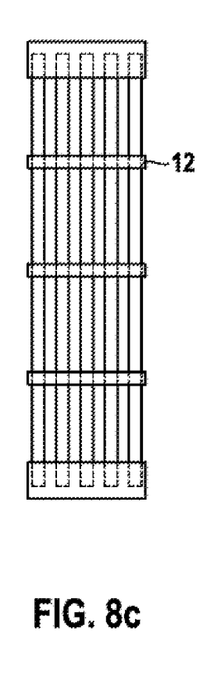
Figure 8D:
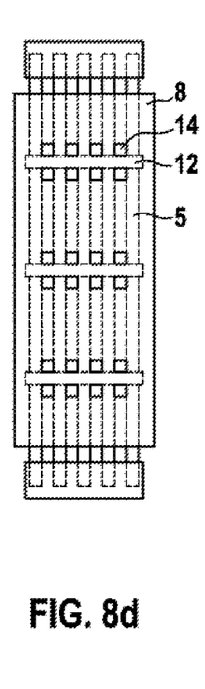
Figure 8E:
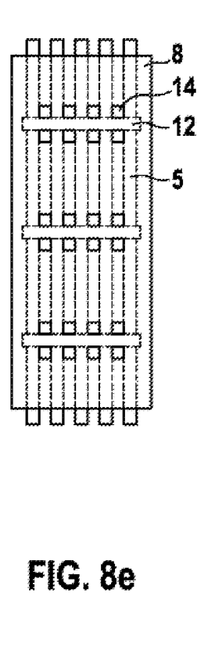
Figure 8F:
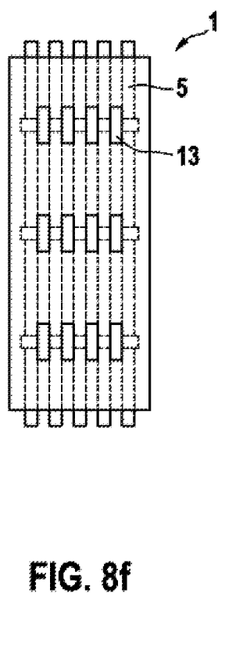

Alternatively, as shown in the configuration illustrated in FIG. 8, first of all the second insert-moldings 8 can be formed (see FIG. 8(d)) and only subsequently can the retaining insert-moldings 12, which are initially formed continuously, be interrupted locally between adjacent conductor tracks 5. For this purpose, openings 14 can be provided in the second insert-molding 8 at positions between adjacent conductor tracks 5, through which openings the retaining insert-molding 12 can be locally punched free (see FIG. 8(f)).

Figure 9A:
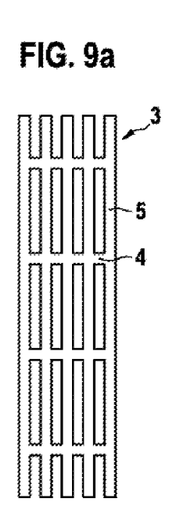
Figure 9B:
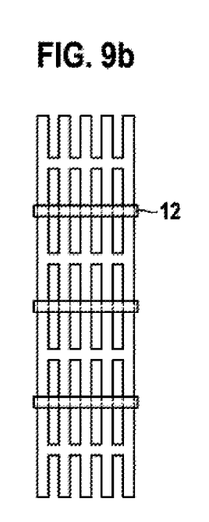
Figure 9C:
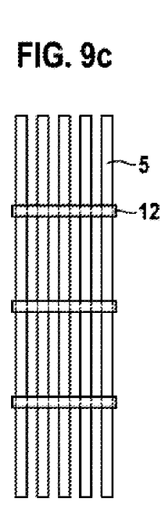
Figure 9D:
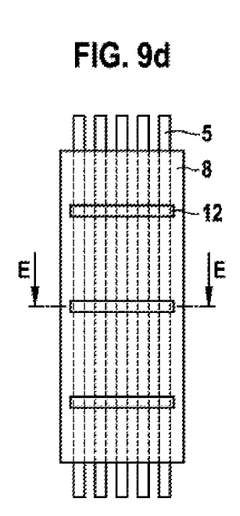
Figure 9E:
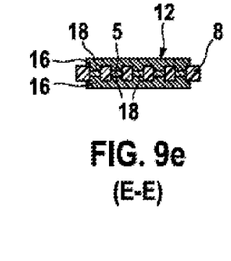
Figure 9F:
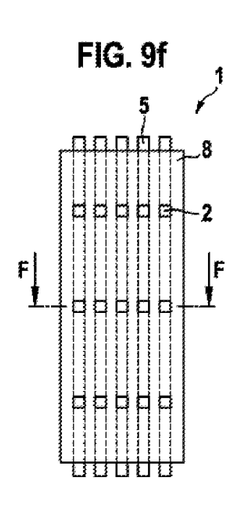
Figure 9G:
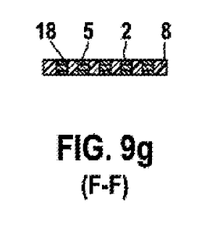

In the production sequence illustrated in FIG. 9, the retaining insert-molding 12 is formed in such a manner that, after the formation of the second insert-molding 8, the retaining insert-molding protrudes outward beyond the latter (i.e. out of the plane of the drawing), as illustrated in the cross section in FIG. 9(e). During the punching free of the webs (see FIG. 9(c)) and during the formation of the second insert-moldings (see FIG. 9(d)), the conductor tracks 5 are held in a stable manner relative to one another via the retaining insert-molding 12. The retaining insert-molding 12 is configured here in such a manner that a plurality of projections 18 project from a continuous part 16, which runs parallel to a surface of the second insert-molding 8, into the second insert-molding 8 in each case and reach there as far as the conductor tracks 5 and surround the latter. Each of the projections 18 encloses only one individual conductor track 5. After the second insert-molding 8 is formed (FIG. 9(d)), the outwardly exposed, continuous part 16 of the retaining insert-molding 12 can subsequently optionally be severed, as shown in FIG. 9(f) and in the cross section of FIG. 9(g), and therefore a continuous connection can no longer arise between adjacent conductor tracks 5 via the retaining insert-molding 12.

The invention claimed is:

1. An insert-molded lead frame, comprising:
   a core element with a plurality of elongate conductor tracks arranged next to one another;
   first partial insert-moldings formed by a first insert molding of the core element on first partial regions of the core element;
   second partial insert-moldings formed by a second insert molding of the core element on second partial regions of the core element;
   wherein the first partial insert-moldings and the second partial insert-moldings together form a complete insert-molding that completely encases the core element,
   wherein the first partial insert-moldings are outwardly exposed through an uppermost outer surface of the complete insert-molding,
   wherein adjacent first partial regions are spaced apart from one another, and
   wherein each of the first partial insert-moldings surrounds only one individual conductor track.

2. The insert-molded lead frame as claimed in claim 1, wherein the first partial insert-moldings are coextensive with the uppermost outer surface of the complete insert-molding.

3. A method for the production of a lead frame, comprising:
   forming first partial insert-moldings on first partial regions of a core element, the core element including a plurality of elongate conductor tracks arranged next to one another;
   forming second partial insert-moldings on second partial regions of the core element,
   wherein the first partial insert-moldings and the second partial insert-moldings together form a complete insert-molding that completely encases the core element,
   wherein adjacent first partial regions are spaced apart from one another, and each of the first partial insert-moldings surrounds only one individual conductor track, and
   wherein the first partial insert-moldings are formed on the first partial regions of the core element by local insert molding of a plurality of adjacent conductor tracks and subsequent interruption of a retaining insert-molding formed in such a manner in regions between adjacent conductor tracks.

4. The method as claimed in claim 3, wherein the retaining insert-molding is interrupted in regions between adjacent conductor tracks before the second partial insert-moldings are formed.

5. The method as claimed in claim 3, wherein the retaining insert-molding is interrupted in regions between adjacent conductor tracks after the second partial insert-moldings are formed.

6. The method as claimed in claim 3, wherein a stabilizing insert-molding connecting a plurality of conductor tracks of the core element is formed on end regions of the core element before the second partial insert-moldings are formed.

7. A transmission control device, comprising:
   an insert-molded lead frame including:
      a core element with a plurality of elongate conductor tracks arranged next to one another;
      first partial insert-moldings formed by a first insert molding of the core element on first partial regions of the core element; and
      second partial insert-moldings formed by a second insert molding of the core element on second partial regions of the core element,
      wherein the first partial insert-moldings and the second partial insert-moldings together form a complete insert-molding that completely encases the core element, and
   wherein adjacent first partial regions are spaced apart from one another,
   wherein the first partial insert-moldings are outwardly exposed through an uppermost outer surface of the complete insert-molding, and
   wherein each of the first partial insert-moldings surrounds only one individual conductor track.

* * * * *